US011171661B2

(12) United States Patent
Oveis Gharan et al.

(10) Patent No.: US 11,171,661 B2
(45) Date of Patent: *Nov. 9, 2021

(54) DIGITAL-TO-ANALOG CONVERTER AND GENERATION OF HIGH-BANDWIDTH ANALOG SIGNALS

(71) Applicant: Ciena Corporation, Hanover, MD (US)

(72) Inventors: Shahab Oveis Gharan, Palo Alto, CA (US); Yuriy Greshishchev, Ottawa (CA); Naim Ben-Hamida, Ottawa (CA); Kim B. Roberts, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/059,547

(22) PCT Filed: May 23, 2019

(86) PCT No.: PCT/IB2019/054306
§ 371 (c)(1),
(2) Date: Nov. 30, 2020

(87) PCT Pub. No.: WO2019/239238
PCT Pub. Date: Dec. 19, 2019

(65) Prior Publication Data
US 2021/0211135 A1    Jul. 8, 2021

Related U.S. Application Data

(63) Continuation of application No. 16/004,673, filed on Jun. 11, 2018, now Pat. No. 10,374,623.

(51) Int. Cl.
*H04B 10/516* (2013.01)
*H03M 1/08* (2006.01)
(Continued)

(52) U.S. Cl.
CPC ......... *H03M 1/0836* (2013.01); *H03M 1/662* (2013.01); *H03M 1/76* (2013.01);
(Continued)

(58) Field of Classification Search
CPC ... H04B 10/516; H04B 10/532; H04B 10/556
(Continued)

(56) References Cited

U.S. PATENT DOCUMENTS 6,781,537 B1   8/2004  Taraschuk et al.
7,277,603 B1  10/2007  Roberts et al.
(Continued)

OTHER PUBLICATIONS

Huang., et al., "An 8-bit 100-GS/s Distributed DAC in 28-nm CMOS for Optical Communications", IEEE Transactions an Microwave Theory and Techniques, Apr. 2015, vol. 63, issue. 4, 8 pages.
(Continued)

*Primary Examiner* — Li Liu
(74) *Attorney, Agent, or Firm* — Clements Bernard Baratta Walker; Lawrence A. Baratta, Jr.; Christopher L. Bernard

(57) ABSTRACT

A controlled switch having N inputs and a single output (N≥2) is switchable between N states. In each state a respective one of the inputs is connected to the single output. There are N sources of sub-streams of analog samples, each sub-stream composed of pairs of adjacent analog samples. Each source is coupled to a respective one of the inputs. In operation, the controlled switch is controlled by a control signal to switch between the N states. While the controlled switch is in any one of the states, a data transition occurs between two adjacent analog samples in the sub-stream whose source is coupled to the input that is connected to the single output. The single output yields a high-bandwidth analog signal. Any pair of adjacent analog samples in any one of the sub-streams substantially determines a corre-
(Continued)

sponding pair of adjacent analog samples in the high-bandwidth analog signal.

19 Claims, 14 Drawing Sheets

(51) Int. Cl.
*H04B 10/532* (2013.01)
*H04Q 11/00* (2006.01)
*H03M 1/76* (2006.01)
*H03M 1/66* (2006.01)
*H04B 10/556* (2013.01)

(52) U.S. Cl.
CPC ......... *H04B 10/516* (2013.01); *H04B 10/532* (2013.01); *H04B 10/556* (2013.01); *H04Q 11/0005* (2013.01); *H04Q 2011/0015* (2013.01)

(58) Field of Classification Search
USPC .................................................. 398/198, 183
See application file for complete search history.

(56) References Cited

U.S. PATENT DOCUMENTS

| 8,693,876 | B2 | 4/2014 | Krause et al. | |
| 9,685,969 | B1 | 6/2017 | Garg et al. | |
| 10,374,623 | B1* | 8/2019 | Gharan | H03M 1/662 |
| 2005/0001752 | A1* | 1/2005 | Ikoma | H03M 1/108 |
| | | | | 341/144 |
| 2009/0102691 | A1* | 4/2009 | Chang | G09G 3/20 |
| | | | | 341/148 |
| 2011/0261086 | A1* | 10/2011 | Tu | G09G 3/3688 |
| | | | | 345/690 |
| 2014/0282805 | A1* | 9/2014 | Bowler | H04B 10/25751 |
| | | | | 725/129 |
| 2017/0134037 | A1* | 5/2017 | Lye | H04B 1/0025 |
| 2017/0250756 | A1* | 8/2017 | Krause | H04B 10/516 |

OTHER PUBLICATIONS

Hungwen L U., et al., "A Tree-Topology Multiplexer for Multiphase Clock System", IEEE Transactions on Circuits and Systems, Regular Papers, IEEE, US, vol. 56, No. 1, Jan. 1, 2009 (Jan. 1, 2009), pp. 124-131, XP011333358.
International Preliminary Report on Patentability for Application No. PCT/IB2019/054306, dated Dec. 24, 2020, 10 pages.
International Search Report and Written Opinion for Application No. PCT/IB2019/054306, dated Oct. 4, 2019, 12 pages.
NTT Corp., "Bandwidth Doubling Technique using AMUX", 2017, pp. 1.
Yamazaki H., et al., "Ultra-Wideband Digital-to-Analog Conversion Technologies for Tbit/s channel transmission", European Conference on Optical Communication (ECOC), Sep. 2017, 3 pages.

* cited by examiner

DIGITAL-TO-ANALOG CONVERTER AND GENERATION OF HIGH-BANDWIDTH ANALOG SIGNALS

TECHNICAL FIELD

This disclosure is related to the technical field of generating analog signals and digital-to-analog conversion.

BACKGROUND

"Ultra-Wideband Digital-to-Analog Conversion Technologies for Tbit/s channel transmission" by Yamazaki et al, presented at ECOC 2017, notes that "high-speed electronic digital-to-analog converters (DACs) are of key importance in modem optical transmission systems" and "in multilevel optical transmitters, the analog bandwidth of the DACs is one of the factors limiting the transmitter's bandwidth". Yamazaki et al. describes a digital-preprocessed analog-multiplexed DAC (DP-AM-DAC) that uses a digital pre-processor, two sub-DACs, and an analog multiplexer (AMUX). "With sub-DACs with a bandwidth of ~½¾, we can generate signals with a bandwidth of ~fB as the output from the AMUX." The AMUX is a heterojunction bipolar transistor (HBT) analog multiplexer (mux). FIG. 2 of Yamazaki et al. shows an interleaving method (type I) and a preprocessed spectrum method (type II) that reduces the switching frequency of the analog mux by a factor of two. However, type 11 is very sensitive to imperfections of the matching of the analog characteristics of the two inputs of the analog mux, as very large signal components need to be almost-perfectly cancelled.

"An 8-bit lOO-GS/s Distributed DAC in 28-nm CMOS for Optical Communications" by Huang et al., IEEE Transactions on Microwave Theory and Techniques, vol. 63, no. 4 (April 2015), discloses a distributed structure to interleave together the outputs from two DACs. Huang et al. uses two interleaved NRZ (non-retum-to-zero) DACs sampled at 90 degrees out of phase with respect to each other and summed up at the output stage. The interleaving is structured to invert one of the image spectra so that they are cancelled when summed. Again, there are very strong interference terms that are suppressed only with precise matching of the two halves of the analog circuit.

U.S. Pat. No. 8,693,876 discloses the combining of two half-band signals from two DACs into a full-band signal, by shifting up the frequency of one of the half-band signals with a bipolar mixer. It is desirable to have the circuit implemented using lower energy technologies such as complementary metal-oxide-semiconductor (CMOS).

Packet and burst switches are known, where typically 1500 bytes received from one tributary are sent in sequence out of one optical or electrical output.

SUMMARY

An apparatus comprises a controlled switch having N inputs and a single output (N≥2), where the controlled switch is switchable between N states. In each state a respective one of the inputs is connected to the single output. There are N sources of sub-streams of analog samples, each sub-stream composed of pairs of adjacent analog samples. Each source is coupled to a respective one of the inputs. In operation, the controlled switch is controlled by a control signal to switch between the N states. While the controlled switch is in any one of the states, a data transition occurs between two adjacent analog samples in the sub-stream whose source is coupled to the input that is connected to the single output. The single output yields the high-bandwidth analog signal. Any pair of adjacent analog samples in any one of the sub-streams substantially determines a corresponding pair of adjacent analog samples in the high-bandwidth analog signal. The apparatus may be a digital-to-analog converter (DAC), where each source is a sub-DAC. The sub-DACs may employ techniques that increase resilience to distortions as well as to time mismatches between sub-DACs.

DETAILED DESCRIPTION

Figure 1:
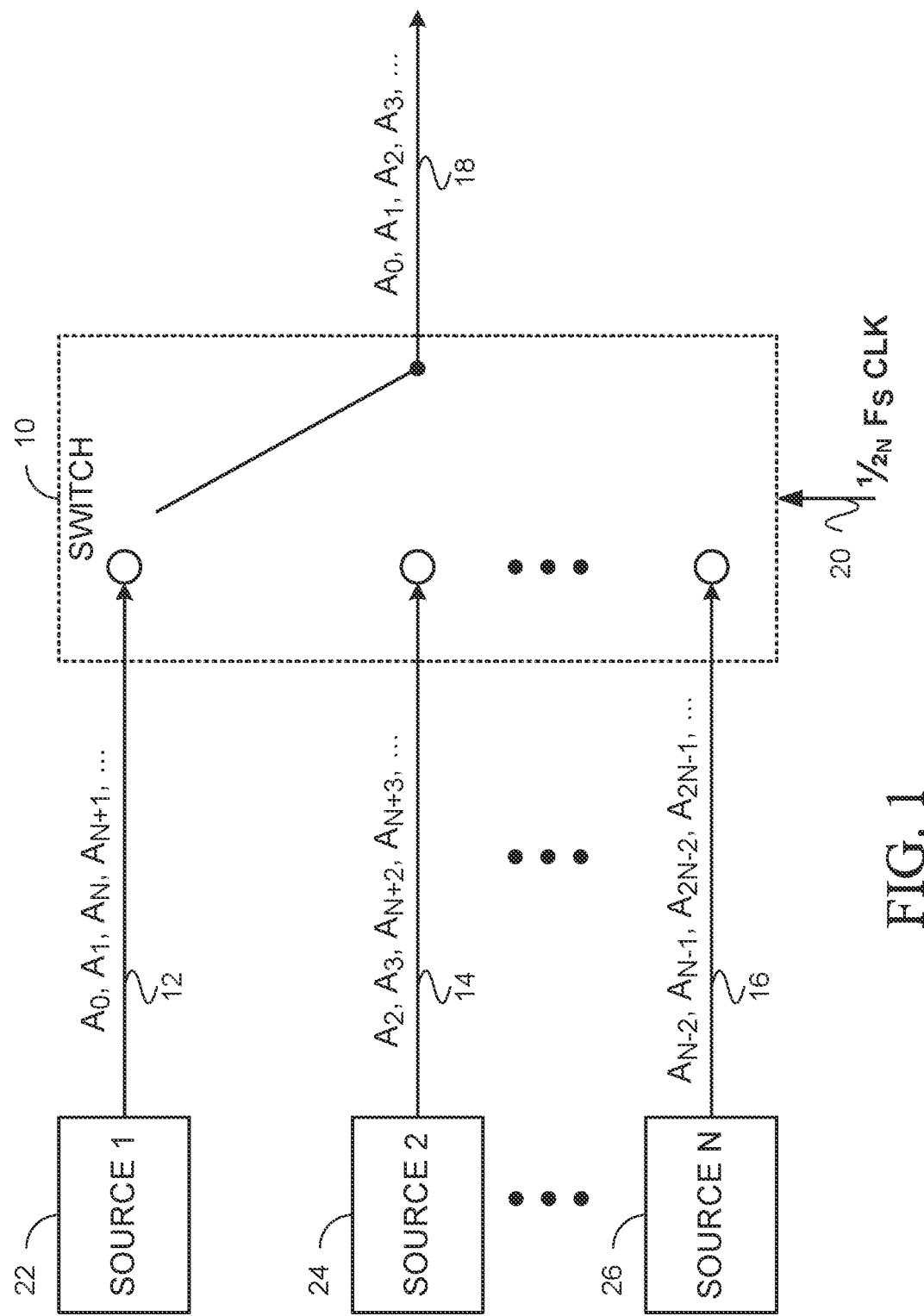
FIG. 1 illustrates a mechanism that relies on data transitions to get an effective sampling rate that is twice the number of sub-streams.

FIG. 1 illustrates a mechanism for creating a high-bandwidth analog signal.

A controlled switch 10 has N inputs and a single output, where the number N of inputs is an integer greater than or equal to two (N≥2). N sub-streams of analog samples are provided as input to the controlled switch 10, each sub-stream to a respective one of the inputs. A first sub-stream 12, a second sub-stream 14 and an A'-th sub-stream 16 are illustrated in FIG. 1.

The controlled switch 10 is operative to produce a high-bandwidth analog signal at a sample rate of Fs. The high-bandwidth analog signal comprises an output stream 18 of analog samples $\{A_0, A_1, A_2, A_3, A_4, A_5, A_6, A_7, \ldots\}$ that contains one analog sample in each time period of duration ~Ts. The symbol "~" is shorthand for the word "approximately". The index i of each analog sample $A_i$ represents an order of the analog samples in the output stream 18. A pair of samples is deemed "adjacent" if the index of the second sample in the pair is one greater than the index of the first sample in the pair.

The controlled switch 10 has N different states. In the first state, the first sub-stream 12 is connected to the output of the controlled switch 10 and thus contributes to the output stream 18. In the second state, the second sub-stream 14 is connected to the output of the controlled switch 10 and thus contributes to the output stream 18. In the A'-th state, the A'-th sub-stream 16 is connected to the output of the controlled switch 10 and thus contributes to the output stream 18.

A control signal 20 having a period of ~2A'Ts controls the controlled switch 10 to switch between the N different states. For example, the control signal 20 is a clock signal operating at a frequency of $$\frac{1}{2N}F_s,$$

and the controlled switch 10 is controlled by rising edges and falling edges of the $$\frac{1}{2N}F_s$$

clock signal 20.

The first sub-stream 12 is intentionally composed of pairs of adjacent analog samples such as {Ao, Ai}, {AN, AN+1}, and {A2N, A2N+1}. The timing of the control signal 20 is intentionally arranged so that a data transition occurs between two adjacent analog samples in the first sub-stream 12 while the controlled switch 10 is in the first state. For example, the analog samples Ao and Ai contribute one after the other to the output stream 18 while the controlled switch 10 is in the first state.

The second sub-stream 14 is intentionally composed of pairs of adjacent analog samples such as {A2, A3}, {AN+2, AN+3}, and {A2N+2, A2N+3}. The timing of the control signal 20 is intentionally arranged so that a data transition occurs between two adjacent analog samples in the second sub-stream 14 while the controlled switch 10 is in the second state. For example, the analog samples A2 and A3 contribute one after the other to the output stream 18 while the controlled switch 10 is in the second state.

The A-th sub-stream 16 is intentionally composed of pairs of adjacent analog samples such as {AN−2, AN−1}, {A2N−2, A2N−1}, and {A3N−2, A3N−2}. The timing of the control signal 20 is intentionally arranged so that a data transition occurs between two adjacent analog samples in the A-th sub-stream 16 while the controlled switch 10 is in the A-th state. For example, the analog samples AN−2 and AN−1 contribute one after the other to the output stream 18 while the controlled switch 10 is in the A-th state.

Two adjacent analog samples in the output stream 18 are substantially determined by a corresponding two adjacent analog samples in one of the sub-streams. For example, the output stream 18 has the analog samples {Ao, Ai, A2, A3, A4, A5, A6, A7, . . . }, and the samples {Ao, Ai} in the output stream 18 are substantially determined by the corresponding samples {Ao, Ai} in the first sub-stream 12, and the samples {A2, A3} in the output stream 18 are substantially determined by the corresponding samples {A2, A3} in the second sub-stream 14. The term "substantially determined" is used to express the fact that the samples in the output stream 18 may not be identical to the samples in the sub-streams. Imperfect circuits may contribute distortion and/or noise. Analog filtering, peaking, hysteresis, reconstruction filtering, and parasitic circuit elements can cause inter-symbol interference (ISI) so that one output sample is a function of more than one input sample, while still being substantially determined by one input sample.

The "capture" of a data transition between two adjacent analog samples in a sub-stream, with both of the adjacent analog samples contributing, one after the other, to the output stream 18, results in an effective sampling rate of twice the number of sub-streams. Stated differently, the mechanism described with respect to FIG. 1 achieves twice the throughput as expected for the number of sub-streams.

It is unconventional, unexpected, and unintuitive to intentionally "capture" a data transition from one analog sample to an adjacent analog sample, because samples are unstable during the data transition, for example, due to the inter-symbol interference (ISI). Usual design practice is to resample the data in the center of the data interval, to avoid the effects of timing jitter, timing offset, and the complicated and potentially asymmetric dynamics of the data transition.

It is a challenge to generate a high-speed clock and to bring the high-speed clock to an analog multiplexer component. Furthermore, an analog multiplexer component controlled by a high-speed clock consumes power that is directly proportional to the clock speed.

One potential benefit of the mechanism described with respect to FIG. 1 is that for a desired sample rate of Fs, it is sufficient to generate and bring to the controlled switch 10 a control signal 20 having a period of ~2N Ts. For example, if there are precisely two sub-streams, then a clock signal 20 operating at ~¼ Fs is sufficient to achieve the desired sample rate of Fs. In another example, if there are precisely four sub-streams, then a clock signal 20 operating at ~½Fs is sufficient to achieve the desired sample rate of Fs. It is much easier for the controlled switch 10 to switch when controlled by a slower clock signal than when controlled by a fast clock signal, and the controlled switch 10 will consume less heat when controlled by the slower clock signal than when controlled by the fast clock signal.

The source of the first sub-stream 12 of analog samples provided as input to the controlled switch 10 is shown conceptually in FIG. 1 as an arbitrary source 22. The source of the second sub-stream 14 of analog samples provided as input to the controlled switch 10 is shown conceptually in FIG. 1 as an arbitrary source 24. The source of the A'-th sub-stream 16 of analog samples provided as input to the controlled switch 10 is shown conceptually in FIG. 1 as an arbitrary source 26.

Another potential benefit of the mechanism described with respect to FIG. 1 is that it involves a single control signal 20 to drive the arbitrary sources 22, 24, 26 and to drive the controlled switch 10. No other control signals or clock signals are required.

Figure 2:
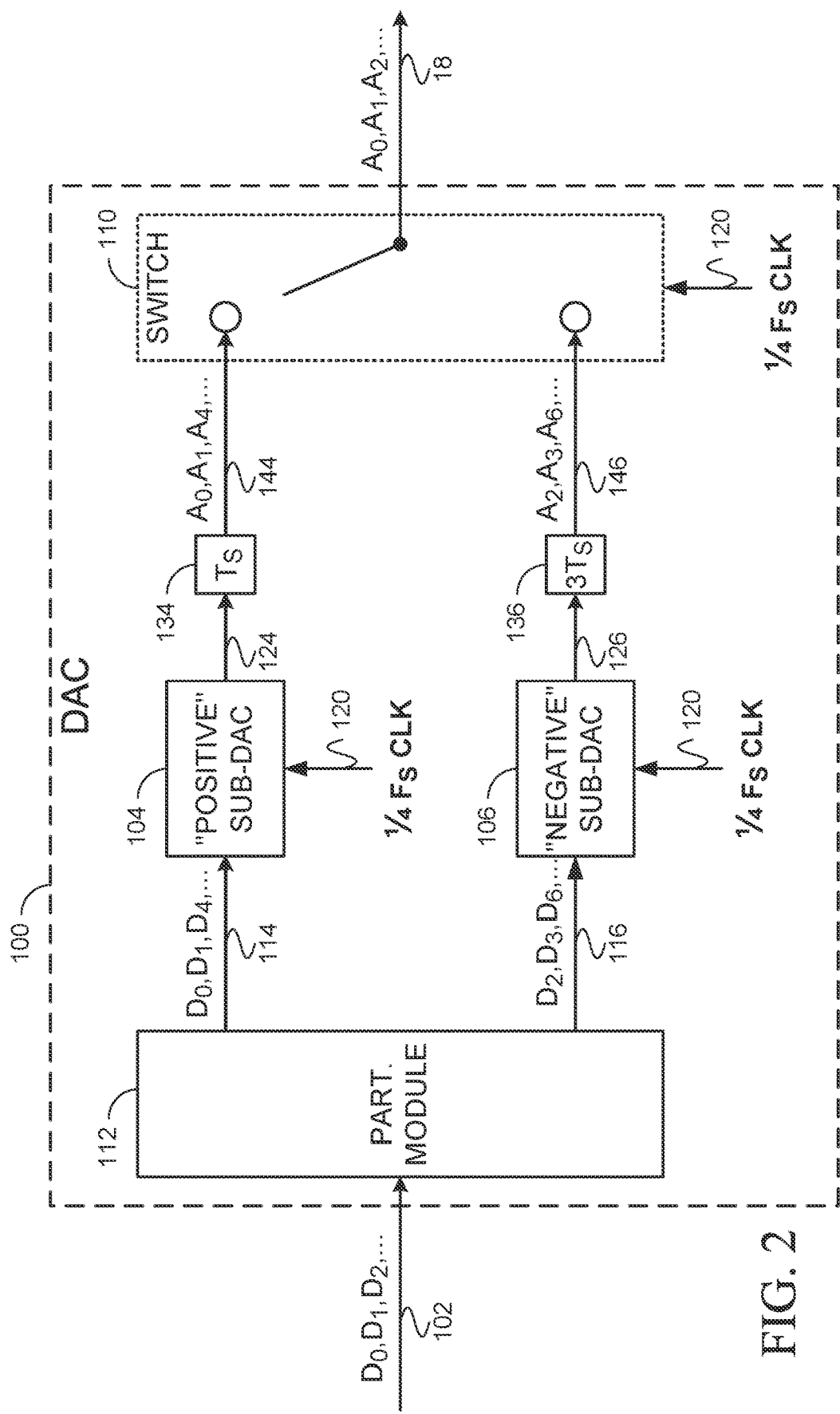
FIG. 2 illustrates an example DAC that uses the mechanism illustrated in FIG. 1.
Figure 4:
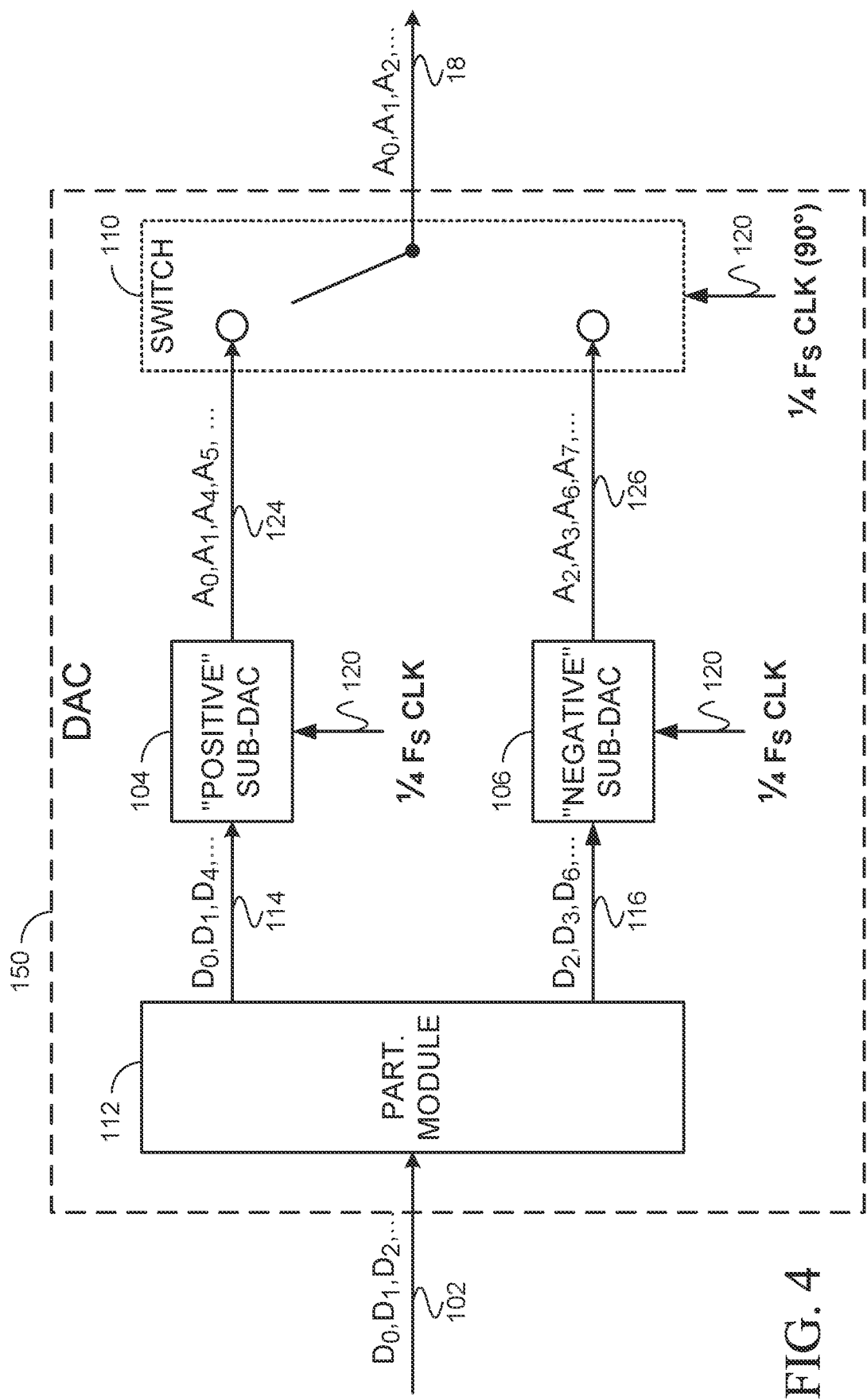
FIG. 4 illustrates an example DAC that is a variant of the DAC of FIG. 2.
Figure 6:
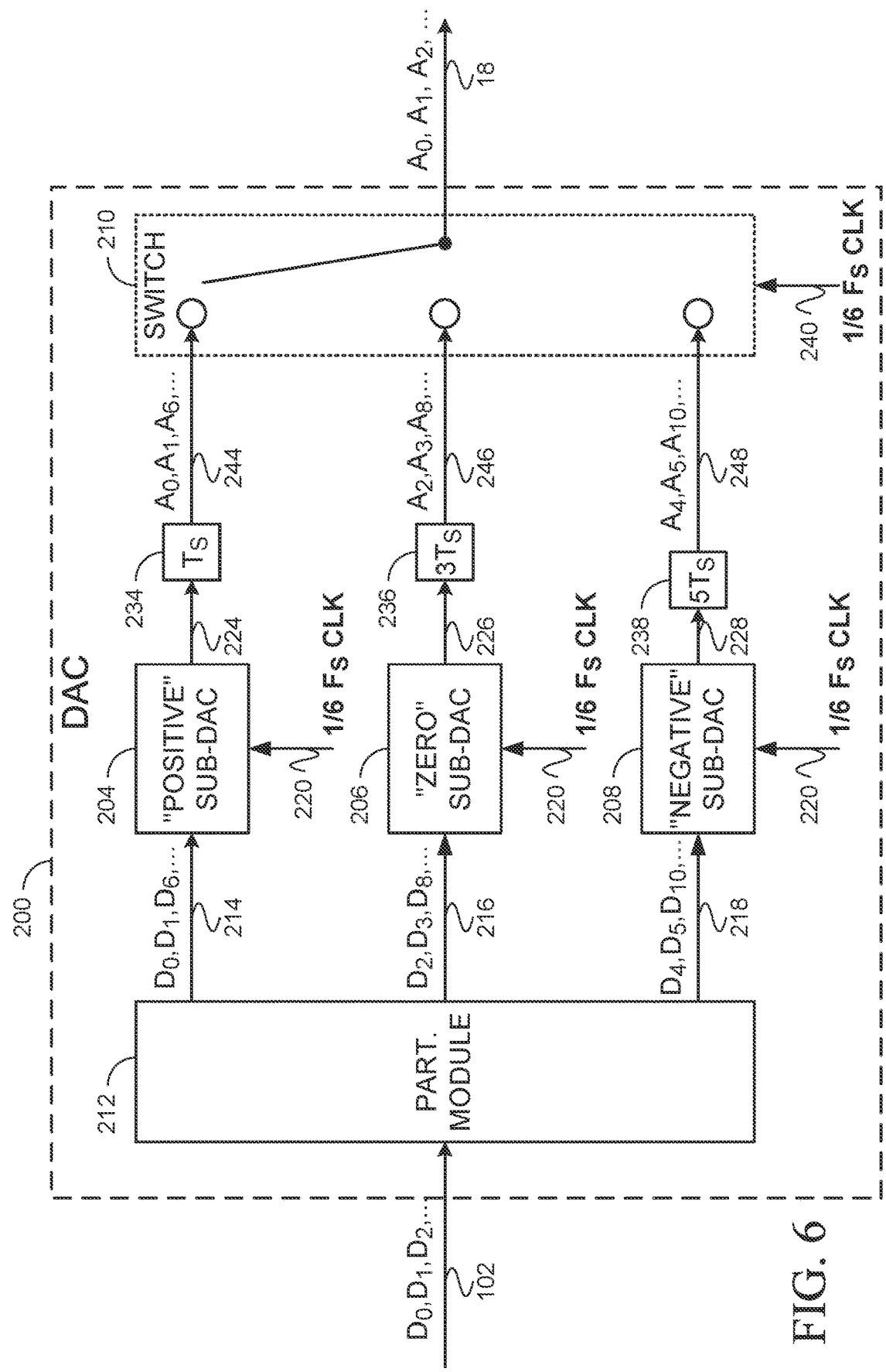
FIG. 6 illustrates another example DAC that uses the mechanism illustrated in FIG. 1.
Figure 8:
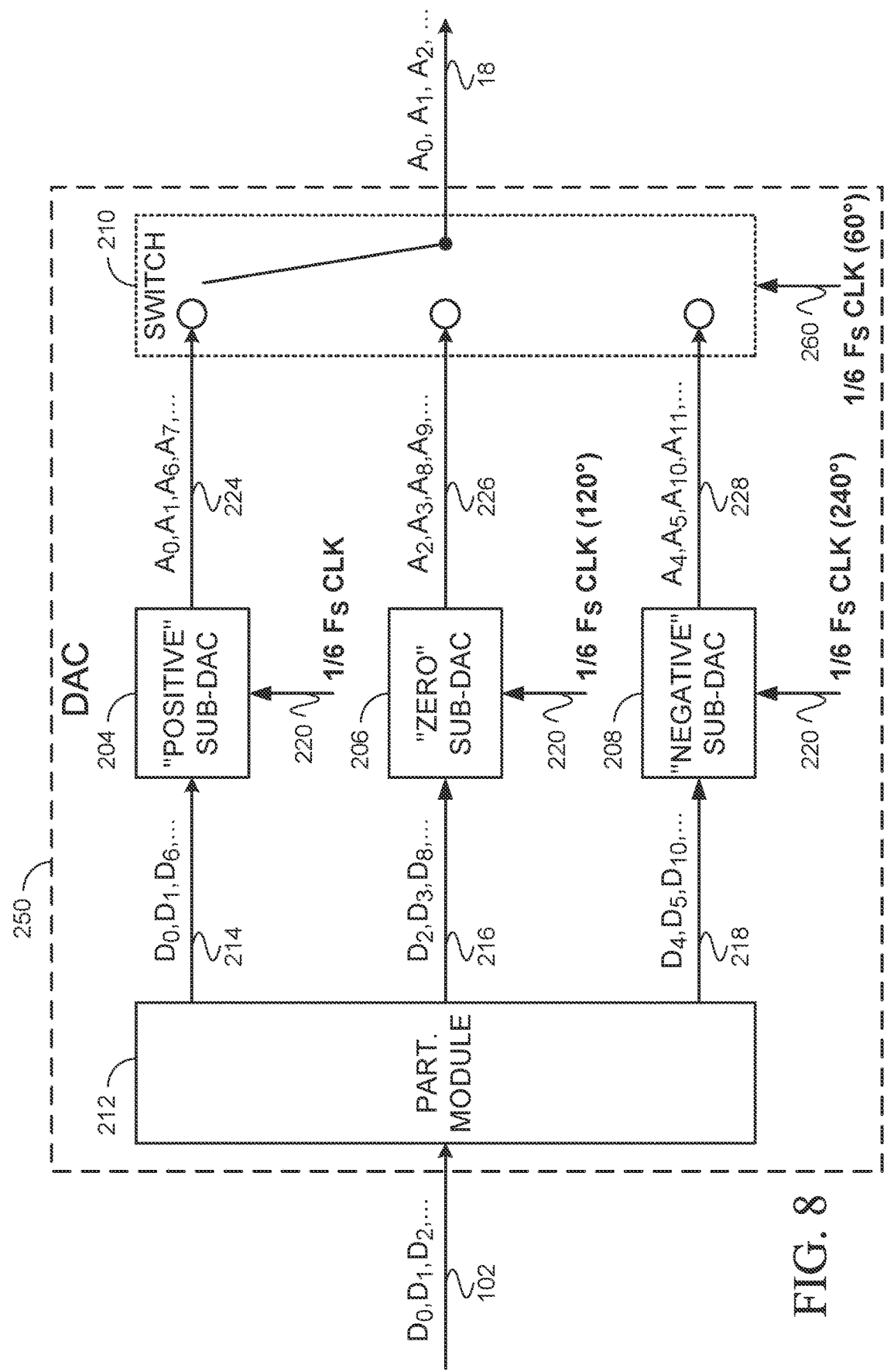
FIG. 8 illustrates an example DAC that is a variant of the DAC of FIG. 6.

Each one of the N sub-streams of analog samples provided as input to the controlled switch 10 may be converted from a respective sub-stream of digital samples (not shown). Various example digital-to-analog converters that employ the mechanism described with respect to FIG. 1 are illustrated in FIG. 2, FIG. 4. FIG. 6, and FIG. 8 and are described hereinbelow. In those example digital-to-analog converters, the arbitrary sources 22, 24, 26 of the N sub-streams of analog samples are sub-DACs controlled by a clock signal operating at a frequency of $$\frac{1}{2N}F_s.$$

Linear digital filtering of the sub-streams of digital samples may adapt the signals in each sub-stream to obtain a cleaner output from the controlled switch 10. This may become more important when the controlled switch 10 is physically further away from the sources of the sub-streams. The linear digital filtering may be calibrated in the factory. Alternatively, local or remote feedback may be used to dynamically control the linear digital filtering.

Nonlinear compensation may be included in the generation of the sub-streams, for example, as described in U.S. Pat. No. 6,781,537 to Taraschuk et al., without memory, or with memory (time delays) in the response. This nonlinear compensation may compensate for nonlinearity in the component DACs, the controlled switch, or downstream elements.

The arrangement of the timing of the control signal 20 relative to the occurrence of data transitions between two adjacent analog samples in the sub-streams may result from delays introduced in the sub-streams. This is the case, for example, in the DACs illustrated in FIG. 2 and FIG. 6.

The arrangement of the timing of the control signal 20 relative to the occurrence of data transitions between two adjacent analog samples in the sub-streams may result from a phase offset between the control signal 20 and clocks used to generate the sub-streams. This is the case, for example, in the DACs illustrated in FIG. 4 and FIG. 8. Phase shifting may be used to obtain precision control of the clock phases. This may be calibrated in the factory. Alternatively, local or remote feedback may be used to dynamically control the phase.

Depending on the implementation, it may be simpler to produce clock signals having zero relative phase offset (as used in the DACs illustrated in FIG. 2 and FIG. 6) than to produce clock signals having a non-zero relative phase offset (as used in the DACs illustrated in FIG. 4 and FIG. 8).

Depending on the implementation, it may be simpler to produce clock signals having non-zero relative phase offset (as used in the DACs illustrated in FIG. 4 and FIG. 8) than to delay analog signals (as used in the DACs illustrated in FIG. 2 and FIG. 6).

FIG. 2 illustrates an example digital-to-analog converter (DAC) 100 that is operative to convert an input stream 102 of digital samples {Do, Di, D2, D3, . . . } into the output stream 18 of analog samples {Ao, Ai, A2, A3, . . . } at a sampling rate of Fs.

Figure 3:
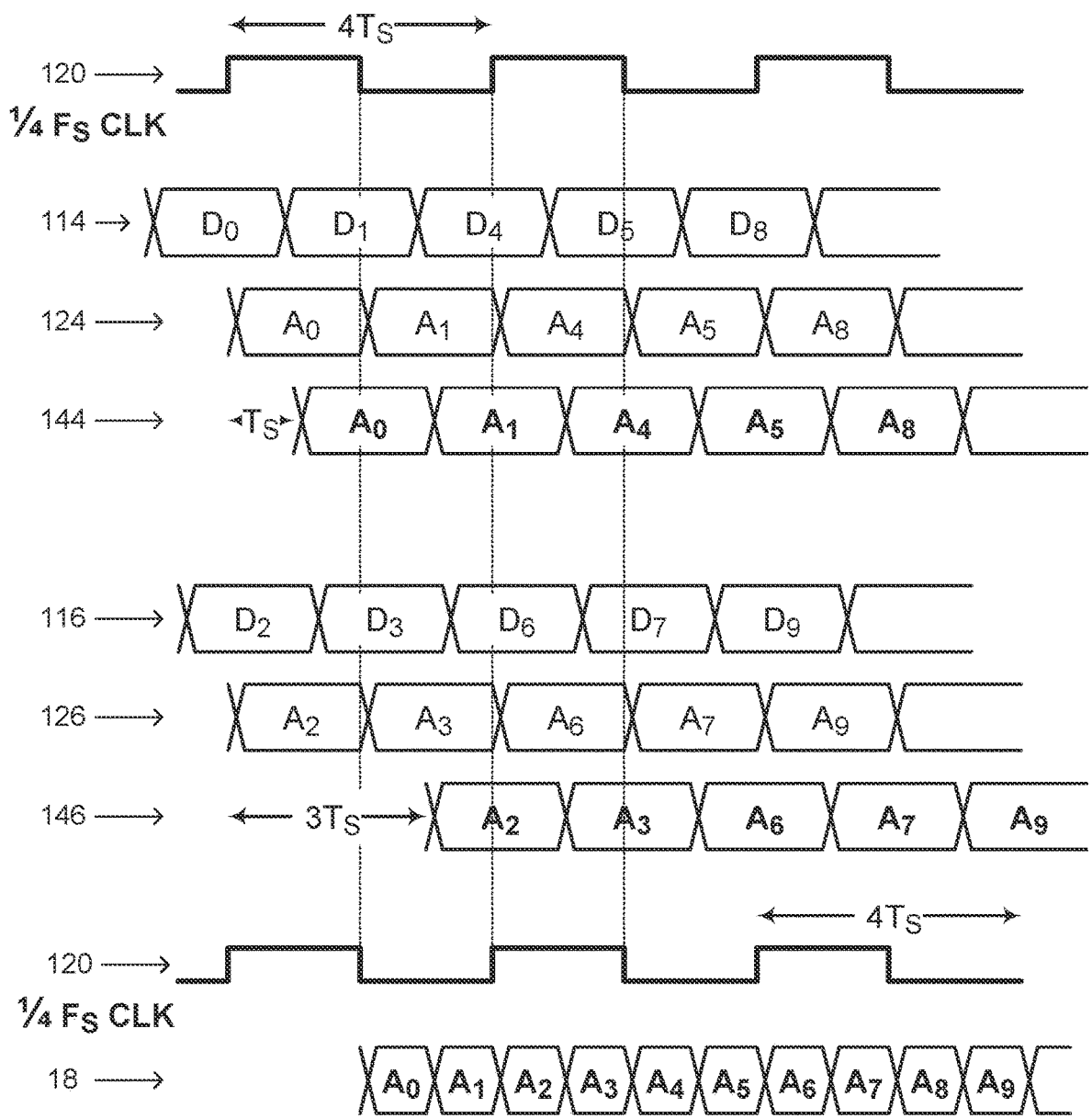
FIG. 3 is a timing diagram of clock signals and data signals in the DAC of FIG. 2.

FIG. 3 is a timing diagram of clock signals and data signals in the DAC 100.

The DAC 100 comprises a "positive" sub-DAC component 104, a "negative" sub-DAC component 106, and a controlled switch 110. The controlled switch 110 has two inputs (coupled to the outputs of the sub-DAC components 104, 106) and a single output (the output stream 18). (The controlled switch 110 is a specific example of the controlled switch 10 described with respect to FIG. 1, where the number of sub-streams is precisely two (A=2).)

The positive sub-DAC component 104 receives as input a first sub-stream 114 of digital samples {Do, Di, D4, D5, . . . }, and the negative sub-DAC component 106 receives as input a second sub-stream 116 of digital samples {D2, D3, D6, D7, . . . }. The first sub-stream 114 is composed of pairs of adjacent digital samples such as {Do, Di}, {D4, D5}, and {ü$_8$, D$_9$[, and the second sub-stream 16 is composed of pairs of adjacent digital samples such as {D2, D3}, {D6, D7}, and {Dio, Du}. A partitioning module 112 comprised in the DAC 100 is operative to partition the input stream 102 of digital samples into the first sub-stream 114 and the second sub-stream 116, using any suitable technique. For example, the partitioning module 112 could reorder every four consecutive samples in the input stream 102 as {Do, D2, Di, D3, D4, D6, D5, D7, . . . }. To obtain the first sub-stream 114 of digital samples {Do, Di, D$_4$, D$_5$, . . . }, the partitioning module 112 could apply a decimate-by-two function to the reordered samples. To obtain the second sub-stream 116 of digital samples {D2, D3, D6, D7, . . . }, the partitioning module 112 could delay a copy of the reordered samples by a delay of duration ~Ts, and then apply a decimate-by-two function.

A clock signal 120 operating at ~% Fs (and therefore having a period of ~4 Ts) is provided to the sub-DAC components 104, 106. The positive sub-DAC component 104 samples the first sub-stream 114 at rising edges and falling edges of the ~% Fs clock signal 120, thus converting the first sub-stream 114 into a first sub-stream 124 of analog samples {Ao, Ai, A$_4$, A5, . . . }. The negative sub-DAC component 106 samples the second sub-stream 116 at rising edges and falling edges of the ~% Fs clock signal 120, thus converting the second sub-stream 116 into a second sub-stream 126 of analog samples {A2, A3, A6, A7, . . . }. An analog delay line 134 is operative to delay the first sub-stream 124 by a delay of duration ~Ts, yielding a first sub-stream 144 of delayed analog samples {Ao, Ai, A$_4$, A5, . . . }. An analog delay line 136 is operative to delay the second sub-stream 126 by a delay of duration ~3 Ts, yielding a second sub-stream 146 of delayed analog samples {A2, A3, A6, A7, . . . }. (The first sub-stream 144 is a specific example of the first sub-stream 12 described with respect to FIG. 1, and the second sub-stream 146 is a specific example of the second sub-stream 14 described with respect to FIG. 1.)

The ~% Fs clock signal 120 is provided, with zero phase offset, to the controlled switch 110. The controlled switch 110 is controlled by rising edges and falling edges of the ~% Fs clock signal 120, switching between a "positive" state in which the first sub-stream 144 of delayed analog samples {Ao, Ai, A$_4$, A5, . . . } contributes to the output stream 18 and a "negative" state in which the second sub-stream 146 of delayed analog samples {A2, A3, A6, A7, . . . } contributes to the output stream 18. The resulting output stream 18 of analog samples {Ao, Ai, A2, A3, A4, A5, A6, A7, . . . } contains one analog sample in each time period of duration ~Ts.

As mentioned, the analog delay line 134 and the analog delay line 136 are operative to introduce delays in the sub-streams of analog samples. These delays result in the arrangement of the timing of the "positive" states and "negative" states of the controlled switch 110 relative to the occurrence of data transitions between two adjacent analog samples in the first sub-stream 144 and in the second sub-stream 146.

While the controlled switch 110 is in the "positive" state, the data transition in the first sub-stream 144 from one analog sample to an adjacent analog sample is captured. While the controlled switch 110 is in the "negative" state, the data transition in the second sub-stream 146 from one analog sample to an adjacent analog sample is captured. For example, the analog samples Ao and Ai contribute one after the other to the output stream 18 during a single half-period of duration ~2 Ts of the ~% Fs clock signal 120, and then the analog samples A2 and A3 contribute one after the other to the output stream 18 during a next single half-period of duration ~2 Ts of the ~% Fs clock signal 120.

The following time-table is helpful for understanding the operation of the DAC 100 and the timing diagram illustrated in FIG. 3.

TABLE 1

| Time/Ts | [0, 1) | [1, 2) | [2, 3) | [3, 4) | [4, 5) | [5, 6) | [6, 7) | [7, 8) |
|---|---|---|---|---|---|---|---|---|
| sub-stream 144 | $A_0$ | $A_1$ | | | $A_4$ | $A_5$ | | $A_8$ |
| sub-stream 146 | | $A_2$ | | $A_3$ | | | $A_6$ | $A_7$ |
| switch 110 state | "positive" | "negative" | | | "positive" | "negative" | | |
| output 18 | $A_0$ | $A_1$ | $A_2$ | $A_3$ | $A_4$ | $A_5$ | $A_6$ | $A_7$ |

By employing the mechanism described above with respect to FIG. 1, the DAC 100 produces the output stream 18 at the rate of ~Fs using clock signals operating solely at ~½ Fs.

FIG. 4 illustrates an example digital-to-analog converter (DAC) 150 that is operative to convert the input stream 102 of digital samples {Do, Di, D2, D3, . . . } into the output stream 18 of analog samples {Ao, Ai, A2, A3, . . . } at the sampling rate of Fs.

Figure 5:
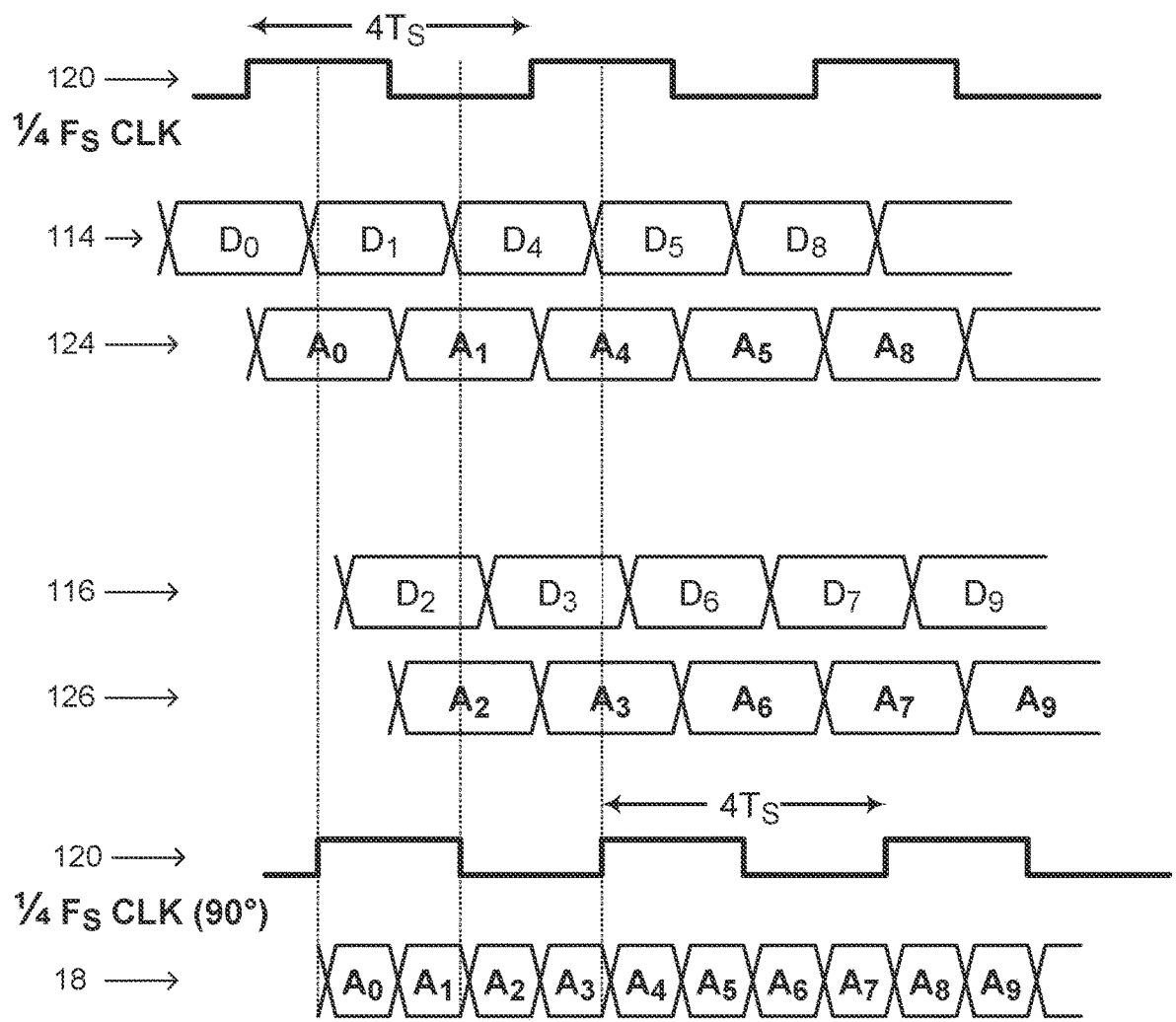
FIG. 5 is a timing diagram of clock signals and data signals in the DAC of FIG. 4.

FIG. 5 is a timing diagram of clock signals and data signals in the DAC 150.

The DAC 150 is a variant of the DAC 100 illustrated in FIG. 2. In contrast to the DAC 100, there are no analog delay lines in the DAC 150. (The first sub-stream 124 is a specific example of the first sub-stream 12 described with respect to FIG. 1, and the second sub-stream 126 is a specific example of the second sub-stream 14 described with respect to FIG. 1.).

In the DAC 150, the ~½ Fs clock signal 120 provided to the controlled switch 110 has a 90° phase offset relative to the ~½ Fs clock signal 120 that is provided to the sub-DAC components 104, 106. The controlled switch 110 is controlled by rising edges and falling edges of the 90° phase offset ~½ Fs clock signal 120, switching between a "positive" state in which the first sub-stream 124 of analog samples {Ao, Ai, A4, A5, . . . } contributes to the output stream 18 and a "negative" state in which the second sub-stream 126 of analog samples {A2, A3, A6, A7, . . . } contributes to the output stream 18. The resulting output stream 18 of analog samples {Ao, Ai, A2, A3, A4, A5, $A_6$, $A_n$, . . . } contains one analog sample in each time period of duration ~Ts.

As illustrated, in the DAC 150, the ~½ Fs clock signal 120 provided to the controlled switch 110 has a 90° phase offset relative to the ~½ Fs clock signal 120 that is provided to the sub-DAC components 104, 106. This 90° phase offset results in the arrangement of the timing of the "positive" states and "negative" states of the controlled switch 110 relative to the occurrence of data transitions between two adjacent analog samples in the first sub-stream 124 and in the second sub-stream 126.

While the controlled switch 110 is in the "positive" state, the data transition in the first sub-stream 124 from one analog sample to an adjacent analog sample is captured. While the controlled switch 110 is in the "negative" state, the data transition in the second sub-stream 126 from one analog sample to an adjacent analog sample is captured. For example, the analog samples Ao and Ai contribute one after the other to the output stream 18 during a single half-period of duration ~2 Ts of the 90° phase offset ~¼Fs clock signal 120, and then the analog samples A2 and A3 contribute one after the other to the output stream 18 during a next single half-period of duration ~2 Ts of the 90° phase offset ~½ Fs clock signal 120.

By employing the mechanism described above with respect to FIG. 1, the DAC 150 produces the output stream 18 at the rate of ~Fs using clock signals operating solely at ~½ Fs.

FIG. 6 illustrates an example digital-to-analog converter (DAC) 200 that is operative to convert the input stream 102 of digital samples {Do, Di, D2, D3, . . . } into the output stream 18 of analog samples {Ao, Ai, A2, A3, . . . } at the sampling rate of Fs.

Figure 7:
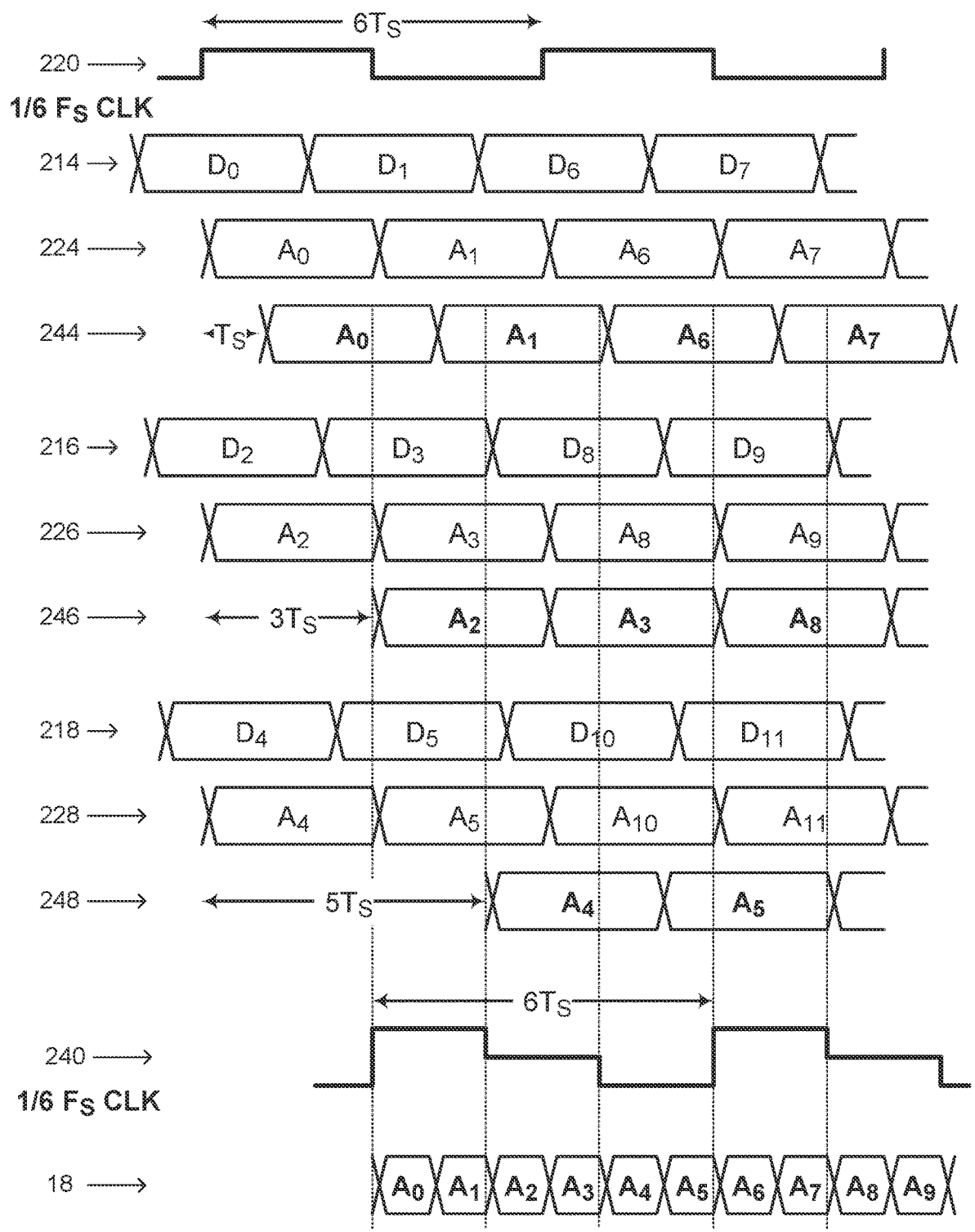
FIG. 7 is a timing diagram of clock signals and data signals in the DAC of FIG. 6.

FIG. 7 is a timing diagram of clock signals and data signals in the DAC 200.

The DAC 200 comprises a "positive" sub-DAC component 204, a "zero" sub-DAC component 206, a "negative" sub-DAC component 208, and a controlled switch 210. The controlled switch 210 has three inputs (coupled to the outputs of the sub-DAC components 204, 206, 208) and a single output (the output stream 18). (The controlled switch 210 is a specific example of the controlled switch 10 described with respect to FIG. 1, where the number of sub-streams is precisely three (N=3).)

The positive sub-DAC component 204 receives as input a first sub-stream 214 of digital samples (Do, Di, D6, D7, . . . ), the zero sub-DAC component 206 receives as input a second sub-stream 216 of digital samples {D2, D3, ü8, D9, , . . . }, and the negative sub-DAC component 208 receives as input a third sub-stream 218 of digital samples {D4, D5, Dio, Du, . . . }. The first sub-stream 214 is composed of pairs of adjacent samples such as {Do, Di}, {D6, D7}, and {D12, D13}, the second sub-stream 216 is composed of pairs of adjacent samples such as {D2, D3}, {Ds, D9}, and {D14, D15}, and the third sub-stream 218 is composed of pairs of adjacent samples such as {D4, D5}, {Dio, Du}, and {Di6, D17}. A partitioning module 212 comprised in the DAC 200 is operative to partition the input stream 102 of digital samples into the first sub-stream 214, the second sub-stream 216, and the third sub-stream 218, using any suitable technique.

A clock signal 220 operating at ~¼Fs (and therefore having a period of ~6 Ts) is provided to the sub-DAC components 204, 206, 208. The positive sub-DAC component 204 samples the first sub-stream 214 at rising edges and falling edges of the ~¼Fs clock signal 220, thus converting the first sub-stream 214 into a first sub-stream 224 of analog samples {Ao, Ai, A6, A7, . . . }. The zero sub-DAC component 206 samples the second sub-stream 216 at rising edges and falling edges of the ~¼Fs clock signal 220, thus converting the second sub-stream 216 into a second sub-stream 226 of analog samples {A2, A3, A8, A9, . . . }. The negative sub-DAC component 208 samples the third sub-stream 218 at rising edges and falling edges of the ~¼Fs clock signal 220, thus converting the third sub-stream 218 into a third sub-stream 228 of analog samples {A4, A5, A10, An, . . . }.

An analog delay line 234 is operative to delay the first sub-stream 224 by a delay of duration ~Ts, yielding a first sub-stream 244 of delayed analog samples {Ao, Ai, A6, A7, . . . }. An analog delay line 236 is operative to delay the second sub-stream 226 by a delay of duration ~3 Ts, yielding a second sub-stream 246 of delayed analog samples {A2, A3, $A_8$, A9, . . . }. An analog delay line 238 is operative to delay the third sub-stream 228 by a delay of duration ~5 Ts, yielding a third sub-stream 248 of delayed analog samples {A4, A5, A10, An, . . . }.

A three-state control signal 240 having a period of ~6 Ts is provided to the controlled switch 210. The controlled switch 210 is controlled by transitions of the three-state control signal 240, switching between a "positive" state in which the first sub-stream 244 of delayed analog samples {Ao, Ai, $A_6$, A7, . . . } contributes to the output stream 18, a "zero" state in which the second sub-stream 246 of delayed analog samples {A2, A3, $A_8$, A9, . . . } contributes to the output stream 18, and a "negative" state in which the third sub-stream 248 of delayed analog samples {A4, A5, A10, An, . . . } contributes to the output stream 18. The resulting output stream 18 of analog samples {Ao, Ai, A2, A3, A4, A5, Aβ, A7, . . . } contains one analog sample in each time period of duration ~Ts.

As illustrated, the three-state control signal 240 has a zero-phase offset relative to the ~¼Fs clock signal 220 provided to the sub-DAC components 204, 206, 208. The delays introduced by the analog delay lines 234, 236, and 238 result in the arrangement of the timing of the "positive", "zero" and "negative" states of the controlled switch 210, respectively, relative to the occurrence of data transitions between two adjacent analog samples in the first sub-stream 244, the second sub-stream 246 and the third sub-stream 248.

While the controlled switch 210 is in the "positive" state, the data transition in the first sub-stream 244 from one analog sample to an adjacent analog sample is captured. While the controlled switch 210 is in the "zero" state, the data transition in the second sub-stream 246 from one analog sample to an adjacent analog sample is captured. While the controlled switch 210 is in the "negative" state, the data transition in the third sub-stream 248 from one analog sample to an adjacent analog sample is captured. For example, the analog samples Ao and Ai contribute one after the other to the output stream 18 during a single third-period of duration ~2 Ts of the control signal 240, and then the analog samples A2 and A3 contribute one after the other to the output stream 18 during a next single third-period of duration ~2 Ts of the control signal 240, and then the analog samples A4 and A5 contribute one after the other to the output stream 18 during a next single third-period of duration ~2 Ts of the control signal 240.

The following time-table is helpful for understanding the operation of the DAC 200 and the timing diagram illustrated in FIG. 7.

TABLE 2

| Time/Ts | [0, 1) | [1, 2) | [2, 3) | [3, 4) | [4, 5) | [5, 6) | [6, 7) | [7, 8) |
|---|---|---|---|---|---|---|---|---|
| sub-stream 244 | $A_0$ | | $A_1$ | | | | $A_6$ | $A_7$ |
| sub-stream 246 | | $A_2$ | | $A_3$ | | | | $A_8$ |
| sub-stream 248 | | | | | $A_4$ | $A_5$ | | |
| switch 210 state | "positive" | | "zero" | | "negative" | | "positive" | |
| output 18 | $A_0$ | $A_1$ | $A_2$ | $A_3$ | $A_4$ | $A_5$ | $A_6$ | $A_7$ |

By employing the mechanism described above with respect to FIG. 1, the DAC 200 produces the output stream at the rate of ~Fs using clock signals operating solely at ~¼Fs.

FIG. 8 illustrates an example digital-to-analog converter (DAC) 250 that is operative to convert the input stream 102 of digital samples {D0, D1, D2, D3, . . . } into the output stream 18 of analog samples {Ao, Ai, A2, A3, . . . } at the sampling rate of Fs.

Figure 9:
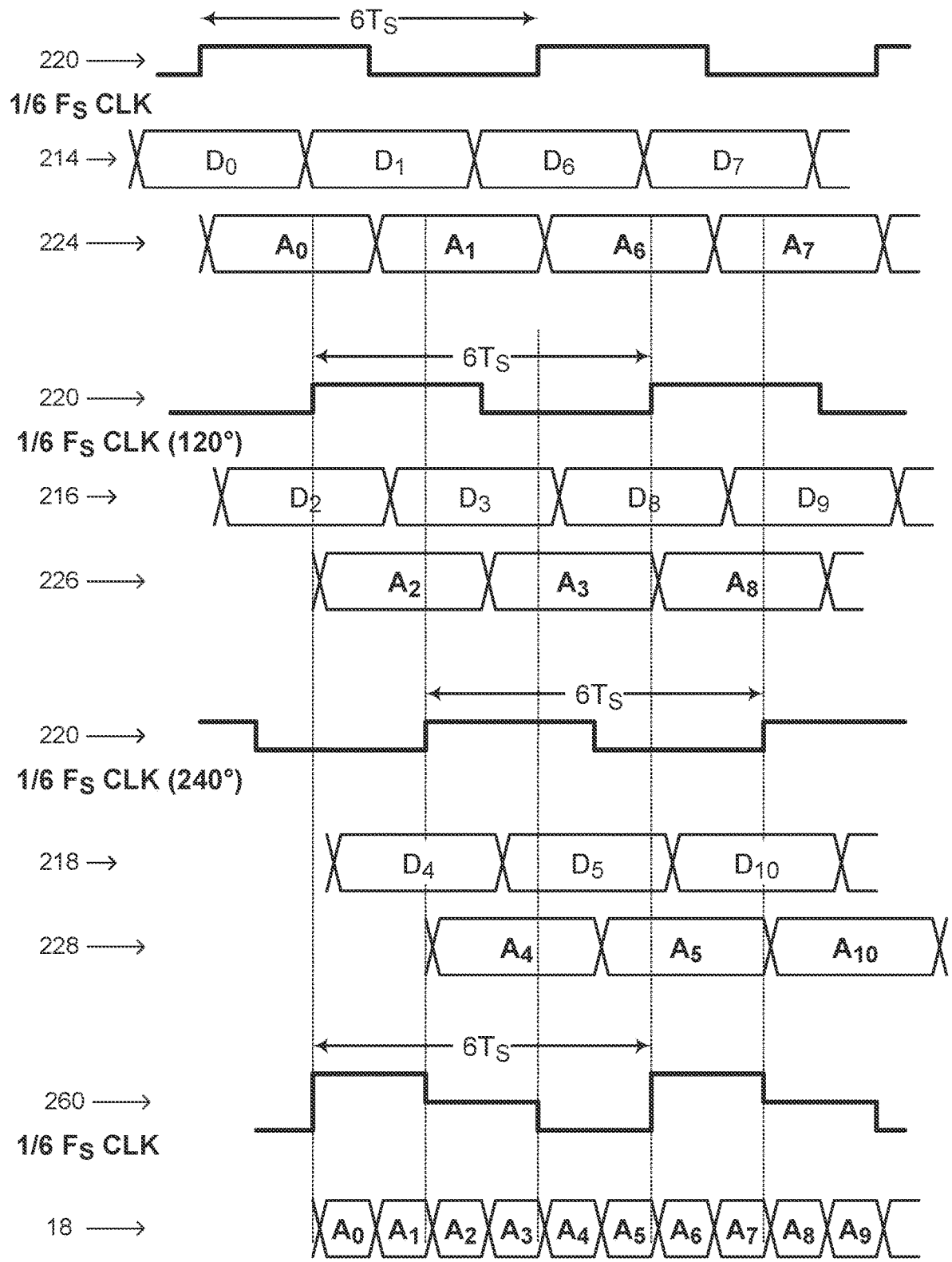
FIG. 9 is a timing diagram of clock signals and data signals in the DAC of FIG. 8.

FIG. 9 is a timing diagram of clock signals and data signals in the DAC 250.

The DAC 250 is a variant of the DAC 200 illustrated in FIG. 5. In contrast to the DAC 200, there are no analog delay lines in the DAC 250.

In the DAC 250, a three-state control signal 260 having a period of ~6 Ts is provided to the controlled switch 210. The controlled switch 210 is controlled by transitions of the three-state control signal 260, switching between a "Positive" state in which the first sub-stream 224 of analog samples {Ao, Ai, A6, A7, . . . } contributes to the output stream 18, a "zero" state in which the second sub-stream 226 of analog samples {A2, A3, As, A9, . . . } contributes to the output stream 18, and a "negative" state in which the third sub-stream 228 of analog samples {A4, A5, A10, An, . . . } contributes to the output stream 18. The resulting output stream 18 of analog samples {Ao, Ai, A2, A3, A4, A5, A6, A7, . . . } contains one analog sample in each time period of duration ~Ts.

As illustrated, the three-state control signal 260 has a 60° phase offset relative to the ~¼Fs clock signal 220. This 60° phase offset results in the arrangement of the timing of the "positive", "zero" and "negative" states of the controlled switch 210 relative to the occurrence of data transitions between two adjacent analog samples in the first sub-stream 224, the second sub-stream 226 and the third sub-stream 228.

While the controlled switch 210 is in the "positive" state, the data transition in the first sub-stream 224 from one analog sample to an adjacent analog sample is captured. While the controlled switch 210 is in the "zero" state, the data transition in the second sub-stream 226 from one analog sample to an adjacent analog sample is captured. While the controlled switch 210 is in the "negative" state, the data transition in the third sub-stream 228 from one analog sample to an adjacent analog sample is captured. For example, the analog samples Ao and Ai contribute one after the other to the output stream 18 during a single third-period of duration ~2 Ts of the three-state control signal 260, and then the analog samples A2 and A3 contribute one after the other to the output stream 18 during a next single third-period of duration ~2 Ts of the three-state control signal 260, and then the analog samples A4 and A5 contribute one after the other to the output stream 18 during a next single third-period of duration ~2 Ts of the three-state control signal 260.

By employing the mechanism described above with respect to FIG. 1, the DAC 250 produces the output stream 18 at the rate of ~Fs using clock signals operating solely at ~¼Fs.

Figure 10:
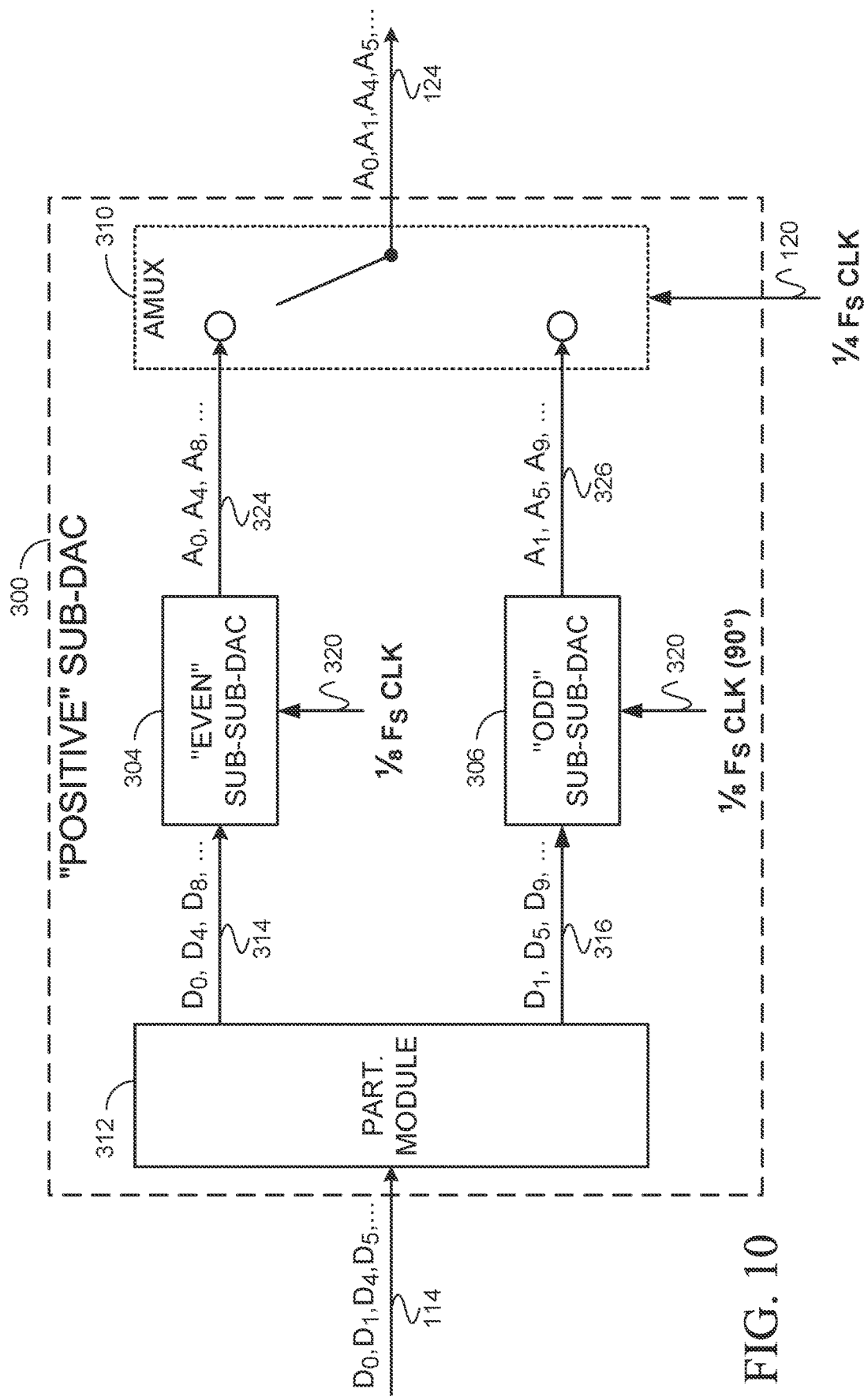
FIG. 10 illustrates an example "positive" sub-DAC for use in the example DACs of FIG. 2 and FIG. 4.

FIG. 10 illustrates an example sub-DAC 300 that is operative to convert digital samples into analog samples. The sub-DAC 300 may optionally be used as the "positive" sub-DAC 104 in DAC 100 or DAC 150 to convert the first sub-stream 114 of digital samples {Do, D1, D4, D5, . . . } into the first sub-stream 124 of analog samples {Ao, Ai, A4, A5, . . . } at a sampling rate of ½Fs.

Figure 11:
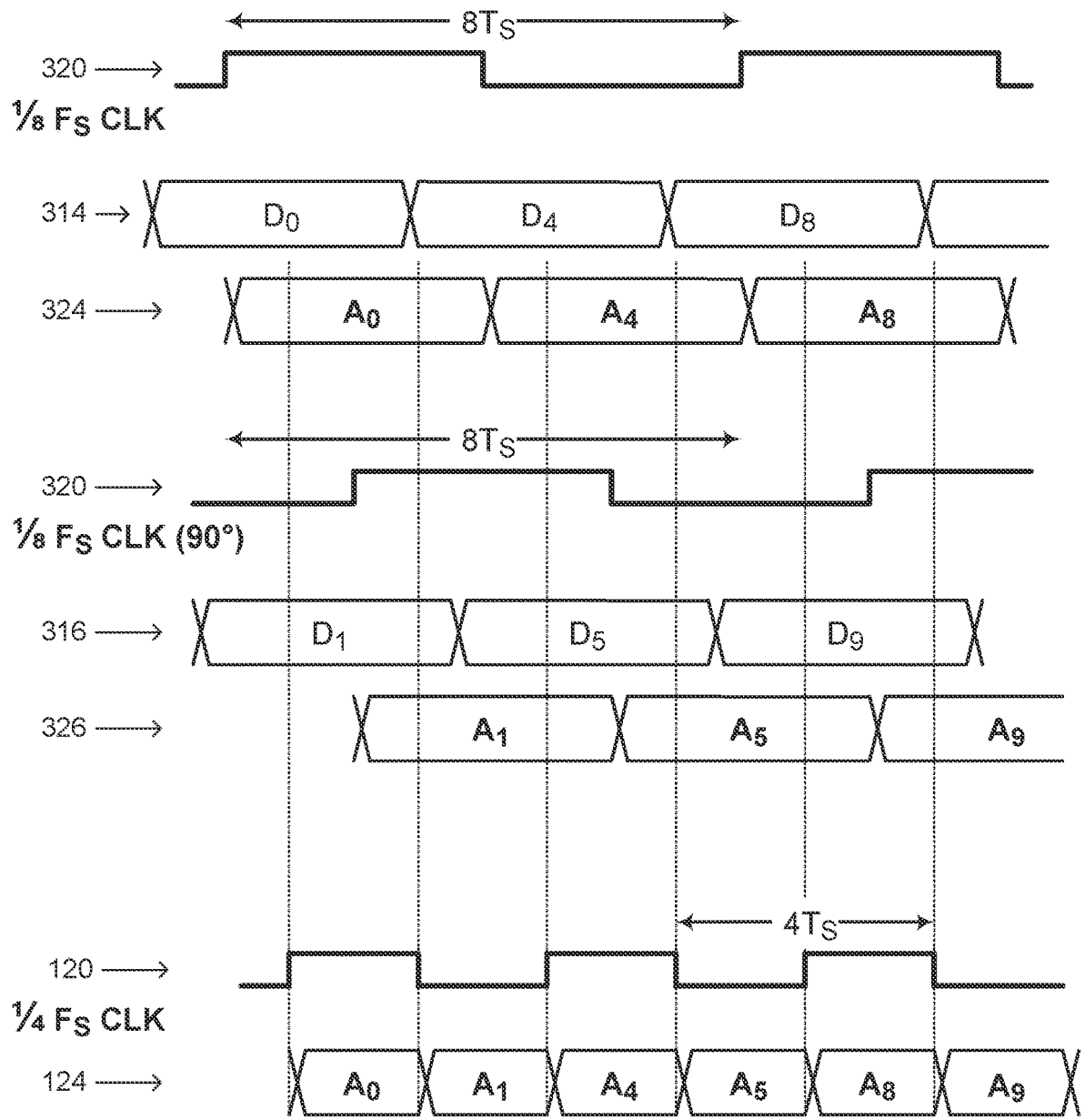
FIG. 11 is a timing diagram of clock signals and data signals in the sub-DAC of FIG. 10.

FIG. 11 is a timing diagram of clock signals and data signals in the sub-DAC 300.

The sub-DAC 300 comprises an "even" sub-sub-DAC component 304, an "odd" sub-sub-DAC component 306, and an analog multiplexer (AMUX) component 310. The AMUX component 310 has two inputs (coupled to the outputs of the sub-sub-DAC components 304, 306) and a single output (the first sub-stream 124).

The even sub-sub-DAC component 304 receives as input a first sub-sub-stream 314 of digital samples {Do, D4, $D_8$, . . . }, and the odd sub-sub-DAC component 306 receives as input a second sub-sub-stream 316 of digital samples {Di, D5, D9, . . . }. A partitioning module 312 is operative to partition the first sub-stream 114 of digital samples into the first sub-sub-stream 314 and the second sub-sub-stream 316, using any suitable technique. For example, the first sub-stream 114 could be duplicated, a delay buffer (not shown) could delay one copy of the first sub-stream 114 by a duration of ~Ts, and decimator elements (not shown) could remove every other sample from the copies of the first sub-stream 114.

A clock signal 320 operating at ~½Fs (and therefore having a period of ~8 Ts) is provided to the sub-sub-DAC components 304, 306. The ~½Fs clock signal 320 provided to the odd sub-sub-DAC component 306 has a 90° phase offset relative to the ~½Fs clock signal 320 provided to the even sub-sub-DAC component 304. The even sub-sub-DAC component 304 samples the first sub-sub-stream 314 at rising edges and falling edges of the ~½Fs clock signal 320, thus converting the first sub-sub-stream 314 into a first sub-sub-stream 324 of analog samples {Ao, A4, A8, . . . }. The odd sub-DAC component 306 samples the second sub-sub-stream 316 at rising edges and falling edges of the 90° phase offset ~½Fs clock signal 320, thus converting the second sub-sub-stream 316 into a second sub-sub-stream 326 of analog samples {Ai, A5, A9, . . . }.

The ~¼ Fs clock signal 120 is provided to the AMUX component 310. The AMUX component 310 is controlled by rising edges and falling edges of the ~¼ Fs clock signal 120, switching between an "even" state in which the first sub-sub-stream 324 of analog samples {Ao, A4, A8, . . . } contributes a single analog sample to the first sub-stream 124 and an "odd" state in which the second sub-sub-stream 326 of analog samples {Ai, A5, A9, . . . } contributes a single analog sample to the first sub-stream 124. The resulting first sub-stream 124 of analog samples {Ao, Ai, A4, A5, A8, A9, . . . } contains one analog sample in each time period of duration ~2 Ts.

The ~¼ Fs clock signal 120 is offset by approximately 90° phase from double the ~½Fs clock signal 320. The ~¼ Fs clock signal 120 is intentionally timed so that no data transition occurs between analog samples in the first sub-sub-stream 324 while the AMUX component 310 is in the "even" state, and no data transition occurs between analog samples in the second sub-sub-stream 326 while the AMUX component 310 is in the "odd" state. Stated differently, all samples in the first sub-stream 124 are captured from stable portions of the sub-sub-streams 324 and 326.

Figure 12:
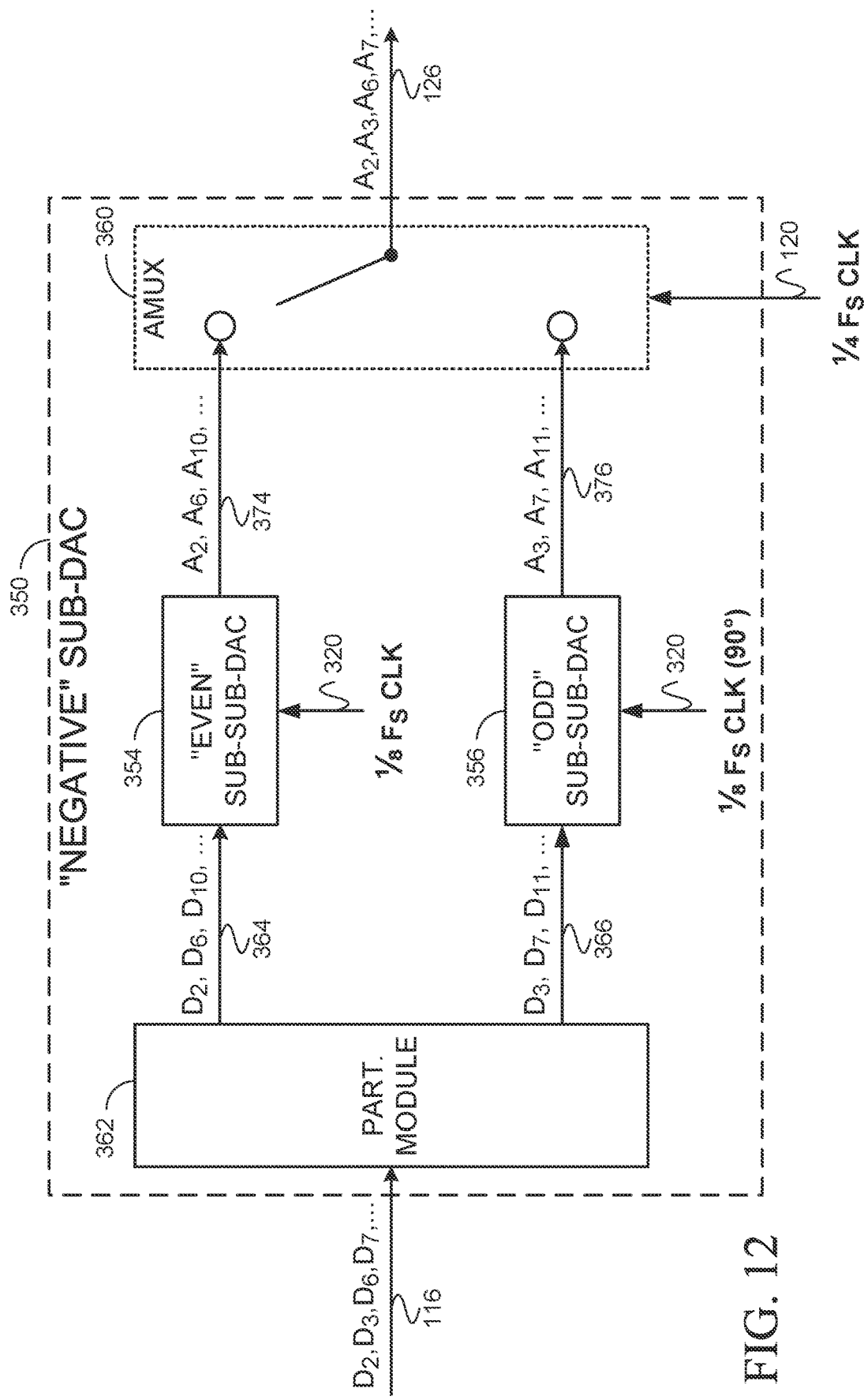
FIG. 12 illustrates an example "negative" sub-DAC for use in the example DACs of FIG. 2 and FIG. 4.

FIG. 12 illustrates an example sub-DAC 350 that is operative to convert digital samples into analog samples. The sub-DAC 350 may optionally be used as the "negative" sub-DAC 106 in DAC 100 or DAC 150 to convert the second sub-stream 116 of digital samples {D2, D3, D6, D7, . . . } into the second sub-stream 126 of analog samples {A2, A3, A6, A7, . . . } at a sampling rate of ½Fs.

Figure 13:
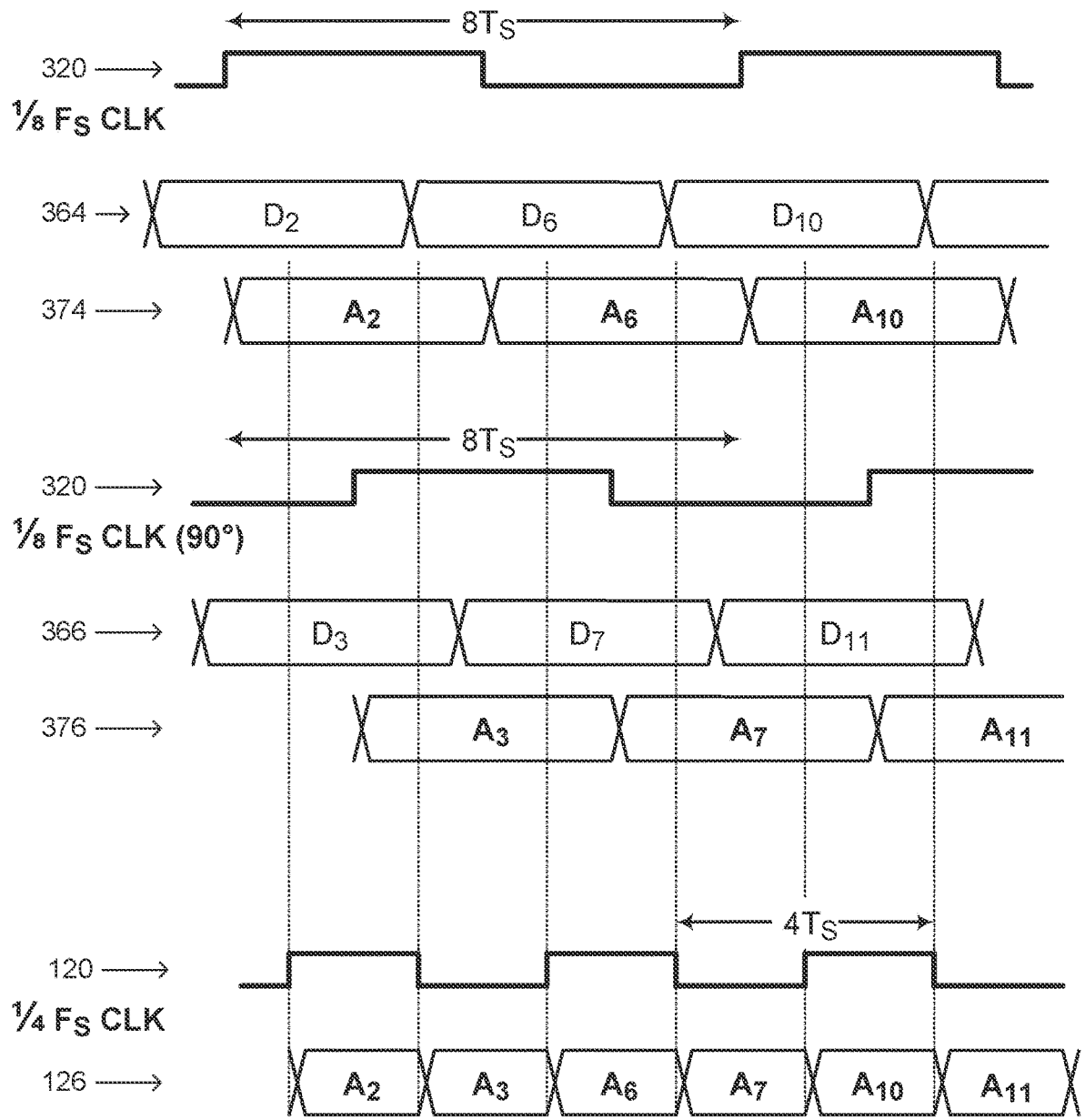
FIG. 13 is a timing diagram of clock signals and data signals in the sub-DAC of FIG. 12.

FIG. 13 is a timing diagram of clock signals and data signals in the sub-DAC 350.

The sub-DAC 350 comprises an "even" sub-sub-DAC component 354, an "odd" sub-DAC component 356, and an analog multiplexer (AMUX) component 360. The AMUX component 360 has two inputs (coupled to the outputs of the sub-sub-DAC components 354, 356) and a single output (the second sub-stream 126).

The even sub-sub-DAC component 354 receives as input a first sub-sub-stream 364 of digital samples {D2, D6, Dio, . . . }, and the odd sub-sub-DAC component 356 receives as input a second sub-sub-stream 366 of digital samples {D3, D7, Du, . . . }. A partitioning module 362 is operative to partition the second sub-stream 116 of digital samples into the first sub-sub-stream 364 and the second sub-sub-stream 366, using any suitable technique. For example, the second sub-stream 116 could be duplicated, a delay buffer (not shown) could delay one copy of the second sub-stream 116 by a duration of ~Ts, and decimator elements (not shown) could remove every other sample from the copies of the second sub-stream 116.

The ~½Fs clock signal 320 is provided to the sub-sub-DAC components 354, 356. The ~½Fs clock signal 320 provided to the odd sub-sub-DAC component 356 has a 90° phase offset relative to the ~⅛Fs clock signal 320 provided to the even sub-sub-DAC component 354. The even sub-sub-DAC component 354 samples the first sub-sub-stream 364 at rising edges and falling edges of the 90° phase offset ~½Fs clock signal 320, thus converting the first sub-sub-stream 364 into a first sub-sub-stream 374 of analog samples {A2, A6, A10 . . . }. The odd sub-DAC component 356 samples the second sub-sub-stream 366 at rising edges and falling edges of the ~½Fs clock signal 320, thus converting the second sub-sub-stream 366 into a second sub-sub-stream 376 of analog samples {A3, A7, A11, . . . }.

The ~¼ Fs clock signal 120 is provided to the AMUX component 360. The AMUX component 360 is controlled by rising edges and falling edges of the ~¼ Fs clock signal 120, switching between an "even" state in which the first sub-sub-stream 374 of analog samples {A2, A6, A10, . . . } contributes a single analog sample to the second sub-stream 126 and an "odd" state in which the second sub-sub-stream 376 of analog samples {A3, A7, An, . . . } contributes a single analog sample to the second sub-stream 126. The resulting second sub-stream 126 of analog samples {A2, A3, A6, A7, A10, An, . . . } contains one analog sample in each time period of duration ~2 Ts.

The ~¼ Fs clock signal 120 is offset by approximately 90° phase from double the ~½Fs clock signal 320. The ~¼ Fs clock signal 120 is intentionally timed so that no data transition occurs between analog samples in the first sub-sub-stream 374 while the AMUX component 360 is in the "even" state, and no data transition occurs between analog samples in the second sub-sub-stream 376 while the AMUX component 360 is in the "odd" state. Stated differently, all samples in the second sub-stream 126 are captured from stable portions of the sub-sub-streams 374 and 376.

Use of the sub-DACs 300 and 350 in the DAC 100 or in the DAC 150 will increase resilience to distortions as well as to time mismatches between sub-DACs, at a cost of increased complexity. The increased complexity involves providing a clock signal at approximately one quarter of the sampling rate (~¼Fs), and the increased complexity may be deemed acceptable.

The following time-table is helpful for understanding use of the sub-DACs 300 and 350 in the operation of the DAC 100.

TABLE 3

| Time/Ts | [0, 1) | [1, 2) | [2, 3) | [3, 4) | [4, 5) | [5, 6) | [6, 7) | [7, 8) |
|---|---|---|---|---|---|---|---|---|
| sub-sub-stream 324 | $A_0$ | | | | $A_4$ | | | $A_8$ |

TABLE 3-continued

| Time/Ts | [0, 1) | [1, 2) | [2, 3) | [3, 4) | [4, 5) | [5, 6) | [6, 7) | [7, 8) |
|---|---|---|---|---|---|---|---|---|
| sub-sub-stream 326 | | $A_1$ | | | | $A_5$ | | |
| AMUX 310 state | "even" | "odd" | | "even" | | "odd" | | "even" |
| sub-stream 124 | $A_0$ | $A_1$ | | $A_4$ | | $A_5$ | | $A_8$ |
| sub-sub-stream 374 | | $A_2$ | | | $A_6$ | | | $A_{10}$ |
| sub-sub-stream 376 | | | $A_3$ | | | | $A_7$ | |
| AMUX 360 state | "even" | "odd" | | "even" | | "odd" | | "even" |
| sub-stream 126 | $A_2$ | $A_3$ | | $A_6$ | | $A_7$ | | $A_{10}$ |
| sub-stream 144 (delayed by Ts relative to sub-stream 124) | $A_0$ | | $A_1$ | | $A_4$ | | $A_5$ | |
| sub-stream 146 (delayed by 3Ts relative to sub-stream 126) | | | $A_2$ | $A_3$ | | | $A_6$ | |
| switch 110 state | "positive" | | "negative" | | "positive" | | | |
| output 18 | $A_0$ | $A_1$ | $A_2$ | $A_3$ | $A_4$ | $A_5$ | $A_6$ | |

Sub-DACs similar to the sub-DACs 300 and 350 could be used as the "positive" sub-DAC, "zero" sub-DAC, and "negative" sub-DAC in the DAC 200 or in the DAC 250.

Figure 14:
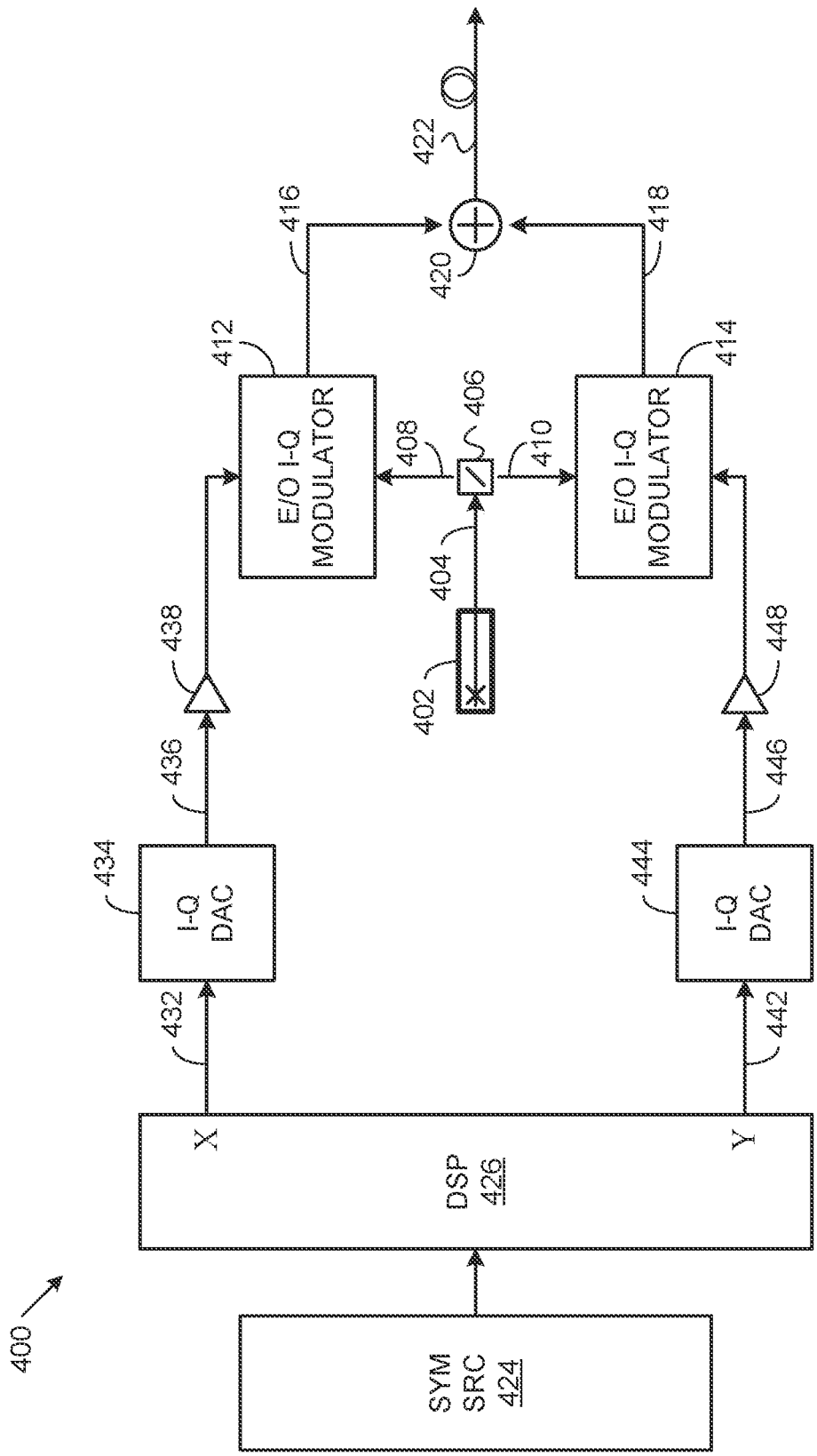
FIG. 14 is a block diagram illustration of an example transmitter.

FIG. 14 is a block diagram illustration of an example transmitter 400 that employs polarization-division multiplexing (PDM). A laser 402 is operative to generate a continuous wave (CW) optical carrier 404. A polarizing beam splitter 406 is operative to split the CW optical carrier 404 into orthogonally-polarized components 408, 410 (nominally referred to as the "X-polarization" component and the "Y-polarization" component) that are modulated by respective electrical-to-optical modulators 412, 414 to produce modulated polarized optical signals 416, 418 that are combined by a beam combiner 420, thus yielding an optical signal 422.

A symbol source 424 is operative to generate a stream of symbols representing data to be transmitted in the optical signal 422. A digital signal processor (DSP) 426 is operative to process the symbols output from the symbol source 424, for example, performing one or more of pulse shaping, subcarrier multiplexing, chromatic dispersion pre-compensation, and distortion pre-compensation on the symbols. The DSP 426 is operative to generate I and Q digital drive signals 432 for the X-polarization to be converted by a DAC 434 into I and Q analog drive signals 436 for the X-polarization that, after amplification by amplifiers 438, are used to drive the electrical-to-optical modulator 412. The DSP 426 is operative to generate I and Q digital drive signals 442 for the Y-polarization to be converted by a DAC 444 into I and Q analog drive signals 446 for the Y-polarization that, after amplification by amplifiers 448, are used to drive the electrical-to-optical modulator 414.

The DACs described in this document could be used as the DAC 434 and the DAC 444. For example, the I and Q digital drive signals 432 for the X-polarization may be the input stream 102 of digital samples {Do, Di, D2, D3 . . . } and the I and Q analog drive signals 436 for the X-polarization may be the output stream 18 of analog samples {Ao, Al, $A_2$, A3, . . . }. For example, the I and Q digital drive signals 442 for the Y-polarization may be the input stream 102 of digital samples {Do, Di, $D_2$, D3 . . . } and the I and Q analog drive signals 446 for the Y-polarization may be the output stream 18 of analog samples {Ao, Ai, $A_2$, A3, . . . }.

Stated differently, each of the DAC 434, 444 may comprise two or more sub-DACs, and the streams of analog samples that are output from the two or more sub-DACs may be provided as inputs to a controlled switch that is a specific example of the controlled switch 10 described with respect to FIG. 1. In some implementations, a sub-DAC may employ the architecture described with respect to FIG. to or FIG. 12.

In some implementations, the DSP 426 and the DACs 434, 444 are comprised in a CMOS module, and the amplifiers 438, 448 are comprised in a BiCMOS module.

In other implementations, when the interconnect between blocks does not support the full bandwidth, the controlled switches of the DACs 434, 444 may be separate from the CMOS module that comprises the DSP 426 and the other components (including the sub-DACs) of the DACs 434, 444. For example, the controlled switches may be comprised in another CMOS module, or a BiCMOS module, or HBT. For example, the controlled switches may be co-packaged with the electrical-to-optical modulator 412, 414 or the driver.

For simplicity of explanation, perfect analog switches were used in the examples, with a square clock. At high frequencies, the clock will generally consist of a fundamental along with one or two harmonics. The controlled switch may be implemented with nonlinear electrical, electro-optic, or optical elements, such as CMOS field effect transistors (FETs) or diodes, bipolar transistors or diodes, heterojunction bipolar transistors (HBTs), electro-absorption (EA) modulators, phase modulators, or semiconductor optical amplifier (SOA) structures. The switching function may be substantially a multiplication by the clock voltage or may include strong nonlinear functional terms.

The techniques described in this document may be used to convert integer sub-streams into a voltage stream, in CMOS. However, other instantiations may be used. For example, current sub-streams may be converted to an optical E-Field stream, as was described in U.S. Pat. No. 7,277,603 to Roberts et al. An integer sub-stream may be combined with a voltage sub-stream to produce a voltage stream. The analog characteristic of the stream that is being created may be an optical or electrical phase, or other modulation of an input analog signal.

A series of integer values that represent a time-series signal may be instantiated in parallel circuits or any other pre-determined pattern.

The scope of the claims should not be limited by the details set forth in the examples, but should be given the broadest interpretation consistent with the description as a whole.

What is claimed is:

1. A digital-to-analog converter (DAC) apparatus operative to create a high-bandwidth analog signal from a digital signal, comprising:
   a partitioning module operative to partition the digital signal into N sub-streams of digital samples, wherein N is an integer greater than or equal to two, each sub-stream of digital samples composed of pairs of adjacent digital samples;
   a controlled switch having N inputs and a single output, the controlled switch being switchable between N different states, where in each state a respective one of the N inputs is connected to the single output; and
   N sub-digital-to-analog converters (sub-DACs), each one of the N sub-DACs coupled to a respective one of the N inputs of the controlled switch, each one of the N sub-DACs operative to convert a respective one of the N sub-streams of digital samples into a respective one of N sub-streams of analog samples, each sub-stream of analog samples composed of pairs of adjacent analog samples,
   where, in operation, the controlled switch is controlled by a control signal to switch between the N different states so that while the controlled switch is in any one of the N different states, a data transition occurs between two adjacent analog samples in the sub-stream converted by the sub-DAC coupled to the input that is connected to the single output, and
   wherein the single output yields the high-bandwidth analog signal, and any pair of adjacent digital samples in any one of the N sub-streams of digital samples substantially determines a corresponding pair of adjacent analog samples in the high-bandwidth analog signal.

2. The DAC apparatus as recited in claim 1, wherein the control signal is at a rate of $1/(2N)$ of a sample rate of the high-bandwidth analog signal.

3. The DAC apparatus as recited in claim 1, wherein each one of the N sub-DACs is driven by a clock at a rate identical to a rate of the control signal.

4. The DAC apparatus as recited in claim 1, wherein each one of the N sub-DACs is driven by the control signal.

5. The DAC apparatus as recited in claim 1, wherein the controlled switch comprises nonlinear electrical elements.

6. The DAC apparatus as recited in claim 1, wherein the controlled switch comprises electro-optical elements.

7. The DAC apparatus as recited in claim 1, wherein the controlled switch comprises optical elements.

8. The DAC apparatus as recited in claim 1, wherein the digital signal comprises multi-bit digital values of in-phase and quadrature components of a target optical e-field modulation.

9. The DAC apparatus as recited in claim 8, wherein the high-bandwidth analog signal is suitable to control an effective length of a control region of an optical modulator.

10. The DAC apparatus as recited in claim 1, wherein the partitioning module, the N sub-DACs, and the controlled switch are comprised in a single complementary metal-oxide-semiconductor (CMOS) module.

11. The DAC apparatus as recited in claim 1, wherein the partitioning module and the N sub-DACs are comprised in a complementary metal-oxide-semiconductor (CMOS) module and the controlled switch is not comprised in the CMOS module.

12. The DAC apparatus as recited in claim 11, wherein the controlled switch is comprised in a separate CMOS module.

13. The DAC apparatus as recited in claim 11, wherein the controlled switch is comprised in a bipolar-CMOS (BiCMOS) module.

14. The DAC apparatus as recited in claim 11, wherein the controlled switch is comprised in a heterojunction bipolar transistor (HBT) module.

15. The DAC apparatus as recited in claim 1, wherein N is equal to two, and the partitioning module is operative:
   to reorder every four consecutive samples in the digital signal as $\{D_0, D_2, D_1, D_3, D_4, D_6, D_5, D_7, \ldots\}$;
   to apply a decimate-by-two function to the reordered samples to obtain a first sub-stream of digital samples $\{D_0, D_1, D_4, D_5, \ldots\}$; and
   to delay a copy of the reordered samples by a delay of duration $\sim TS$ and then apply a decimate-by-two function to the delayed copy of the reordered samples to obtain a second sub-stream of digital samples $\{D_2, D_3, D_6, D_7, \ldots\}$,
   wherein the high-bandwidth analog signal contains one analog sample in each time period of duration $\sim TS$.

16. The DAC apparatus as recited in claim 1, further comprising a linear digital filter to adapt the N sub-streams of digital samples.

17. The DAC apparatus as recited in claim 1, wherein the partitioning module is operative to perform nonlinear compensation when generating the N sub-streams of digital samples.

18. The DAC apparatus as recited in claim 1, further comprising an analog delay line operative to delay at least one of the N sub-streams of digital samples relative to at least another one of the N sub-streams of digital samples.

19. The DAC apparatus as recited in claim 1, wherein each one of the N sub-DACs comprises:
   an analog multiplexer component having a first input, a second input, and a single output;
   a first sub-sub-DAC coupled to the first input, the first sub-sub-DAC operative to convert a first sub-sub-stream of digital samples into a first sub-sub-stream of analog samples; and
   a second sub-sub-DAC coupled to the second input, the second sub-sub-DAC operative to convert a second sub-sub-stream of digital samples into a second sub-sub-stream of analog samples,
   where, in operation, the analog multiplexer component is controlled to switch between a first state in which the first input is connected to the single output of the analog multiplexer component and a second state in which the second input is connected to the single output of the analog multiplexer component, and
   wherein no data transition occurs between analog samples in the first sub-sub-stream while the analog multiplexer component is in the first state and no data transition occurs between analog samples in the second sub-sub-stream while the analog multiplexer component is in the second state.

* * * * *

UNITED STATES PATENT AND TRADEMARK OFFICE
CERTIFICATE OF CORRECTION

PATENT NO. : 11,171,661 B2
APPLICATION NO. : 17/059547
DATED : November 9, 2021
INVENTOR(S) : Shahab Oveis Gharan et al.

It is certified that error appears in the above-identified patent and that said Letters Patent is hereby corrected as shown below:

In the Drawings

FIGURE 1 is replaced with the following corrected FIGURE 1 as shown on the attached drawing sheet In the Specification Column 3, Line 27 should read:
--of adjacent analog samples such as $\{A_0, A_1\}$ and--

Column 3, Lines 36-37 should read:
--pairs of adjacent analog samples such as $\{A_2, A_3\}$ and $\{A_{2N+2}, A_{2N+3}\}$. The timing of the control signal--

Column 3, Lines 45-46 should read:
--of adjacent analog samples such as $\{A_{2N-2}, A_{2N-1}\}$ and $\{A_{4N-2}, A_{4N-1}\}$. The timing of the control--

Signed and Sealed this
Twenty-seventh Day of September, 2022

Katherine Kelly Vidal
*Director of the United States Patent and Trademark Office*